(12) United States Patent  
Wago et al.

(10) Patent No.: US 8,719,616 B2
(45) Date of Patent: *May 6, 2014

(54) METHOD FOR ENCODER FREQUENCY-SHIFT COMPENSATION

(71) Applicant: Seagate Technology, LLC, Scotts Valley, CA (US)

(72) Inventors: Koichi Wago, Sunnyvale, CA (US); Sundeep Chauhan, Fremont, CA (US); David M. Tung, Livermore, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,098

(22) Filed: Feb. 22, 2013

(65) Prior Publication Data

US 2013/0169315 A1    Jul. 4, 2013

Related U.S. Application Data

(63) Continuation of application No. 13/098,281, filed on Apr. 29, 2011, now Pat. No. 8,402,303.

(51) Int. Cl.
*G06F 1/00* (2006.01)
*H04L 7/00* (2006.01)

(52) U.S. Cl.
USPC ........... 713/503; 713/400; 713/401; 713/500; 713/501; 713/600; 375/303; 375/305; 375/334; 375/336

(58) Field of Classification Search
USPC .......... 713/400, 401, 501, 503, 600; 375/303, 375/305, 334, 336
See application file for complete search history.

(56) References Cited

U.S. PATENT DOCUMENTS

| 4,079,456 | A | * | 3/1978 | Lunsford et al. | 713/401 |
| 4,713,830 | A | * | 12/1987 | McDonald | 375/358 |
| 4,780,844 | A | * | 10/1988 | Keller | 710/58 |
| 5,294,894 | A | * | 3/1994 | Gebara | 331/1 A |
| 6,581,164 | B1 | * | 6/2003 | Felts et al. | 713/400 |
| 7,519,844 | B2 | * | 4/2009 | Kizer et al. | 713/400 |
| 8,402,303 | B2 | * | 3/2013 | Wago et al. | 713/503 |

FOREIGN PATENT DOCUMENTS

JP    2006092724    4/2006

* cited by examiner

*Primary Examiner* — Mark Connolly

(57) ABSTRACT

A method for encoder frequency-shift compensation includes determining frequency values of an input encoder signal, determining repeatable frequency-shifts of the frequency values and generating a frequency-shift compensated clock using the repeatable frequency-shifts. A frequency-shift compensated clock includes a synthesizer configured to generate a frequency-shift compensated clock signal using repeatable frequency shifts and encoder clock signals.

21 Claims, 5 Drawing Sheets

METHOD FOR ENCODER FREQUENCY-SHIFT COMPENSATION

CROSS-REFERENCE TO RELATED APPLICATIONS

This application is a continuation application of U.S. patent application Ser. No. 13/098,281, filed on Apr. 29, 2011, the disclosure of which is hereby incorporated by reference in its entirety.

BACKGROUND

In rotary-stage e-beam writer systems, an encoder is used to generate a clock for angular-position reference of the rotary stage. Patterns are recorded synchronously to the encoder clock. The eccentricity of the encoder or uneven marks of the encoder result in a frequency-shift of the encoder clock, causing the recorded pattern to have frequency-shifts.

DETAILED DESCRIPTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the present invention.

General Overview:

It should be noted that the descriptions that follow, for example, in terms of a method for encoder frequency-shift compensation is described for illustrative purposes and the underlying system can apply to any number and multiple types of patterned or discrete track stack or media systems. In one embodiment, the method for encoder frequency-shift compensation can be configured using a phase control system which can be a phase locked loop counter to learn the repeatable frequency-shifts. The method for encoder frequency-shift compensation can be configured to generate a frequency-shift compensated clock for use in e-beam writer systems and can be configured to generate a frequency-shift compensated clock for use in any rotary staged system.

Figure 1:
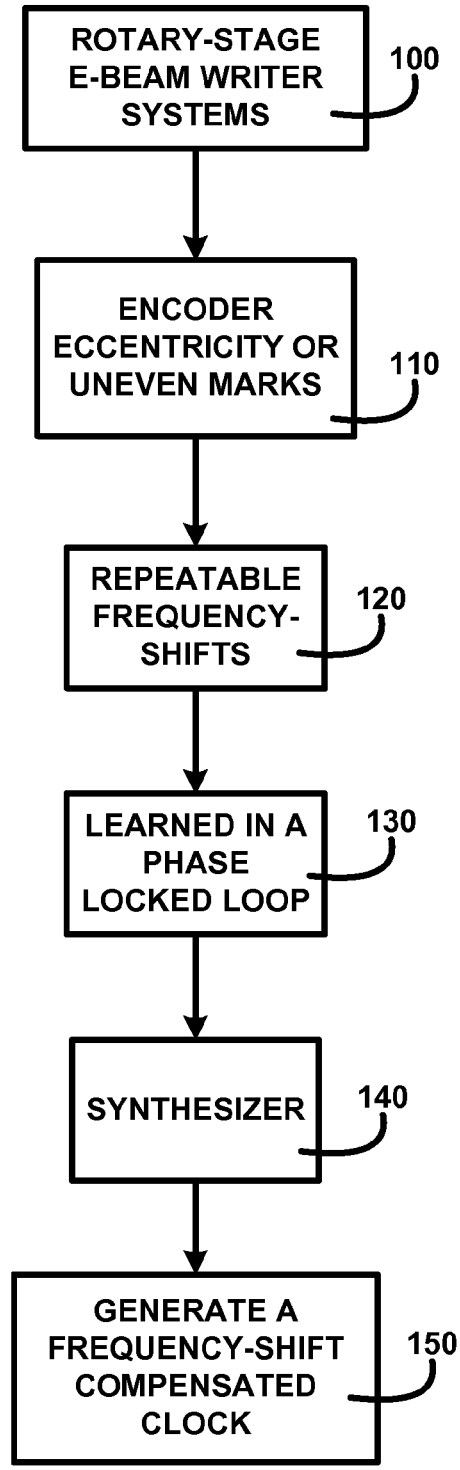
FIG. 1 shows a block diagram of an overview of a method for encoder frequency-shift compensation of one embodiment.

FIG. 1 shows a block diagram of an overview of a method for encoder frequency-shift compensation of one embodiment. FIG. 1 shows rotary-stage e-beam writer systems 100 using an encoder to generate a system master clock. The system master clock is used to track the rotary position of the rotary-stage e-beam writer systems 100. The rotary position is used to identify sections of the bit-patterned or discrete track stack. The identified section is recorded along with information being written on the stack. This allows fast retrieval. The encoder produces frequency signals as the shaft rotates. The frequency signals are converted to clock signals that are processed in a counter chip. The clock signal includes the direction of rotation. The clock signal has errors due to frequency-shifts. The frequency-shifts occur because of encoder eccentricity or uneven marks 110. The encoder eccentricity or uneven marks 110 create repeatable frequency-shifts 120.

In one embodiment the repeatable frequency-shifts 120 are learned in a phase locked loop 130. The phase locked loop generates an output signal that is related to the phase of the input signal from the encoder. The values of the repeatable frequency-shifts 120 such as the phase are processed in a synthesizer 140. The synthesizer 140 produces a signal that is broken down into the values of the repeatable frequency-shifts 120 such as the phase and frequency. The method for encoder frequency-shift compensation continues to analyze the values of the repeatable frequency-shifts 120 such as the phase and frequency.

The values of the repeatable frequency-shifts 120 learned in a phase locked loop 130 analyzed are used to compensate for the encoder eccentricity or uneven marks 110 and generate a frequency-shift compensated clock 150. The frequency-shift compensated clock signals are then used to track the rotary position of the rotary-stage e-beam writer systems 100. The increased accuracy created by the method for encoder frequency-shift compensation increases the quality of patterned or discrete track stack or media systems used for example to pattern a stack.

DETAILED DESCRIPTION

Figure 2A:
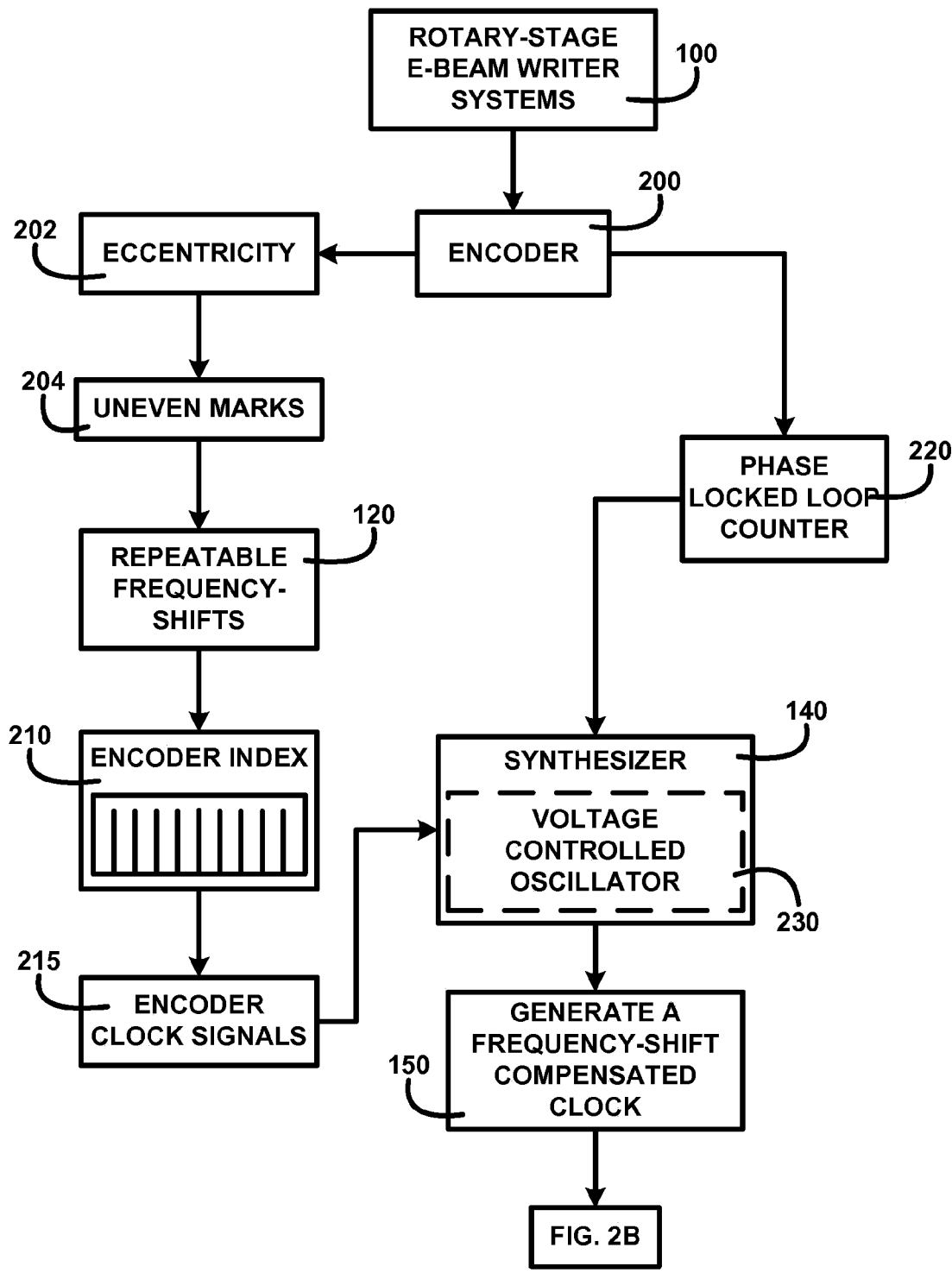
FIG. 2A shows a block diagram of an overview flow chart of a method for encoder frequency-shift compensation of one embodiment.

FIG. 2A shows a block diagram of an overview flow chart of a method for encoder frequency-shift compensation of one embodiment. FIG. 2A shows rotary-stage e-beam writer systems 100 using an encoder 200 to generate a clock for angular-position reference of the rotary stage for position synchronization from a reference index. Timing signals generated by the encoder supplies a clock signal with a frequency producing the system clock. The encoder 200 can create frequency-shifts due to eccentricity 202 such as deviating from a circular path or uneven marks 204. The encoder pulses including the frequency-shifts are recorded in the encoder index 210. The encoder index 210 provides encoder clock signals 215 reference mark pulses to identify the angular-position of for example a pattern written on a stack. The frequency-shifts create errors in the encoder clock signals 215 position reference mark. The encoder produces repeatable frequency-shifts 120.

Phase Locked Loop:

The repeatable frequency-shifts 120 are detectable using a phase locked loop 220. The values of the repeatable frequency-shifts 120 such as phase can be learned in a phase locked loop 130 of FIG. 1. The frequency-shift can be detected by the differences in the encoder index 210 encoder clock signals 215 frequency phase and the values learned in the phase locked loop 220.

Synthesizer:

The values detected in the phase locked loop 220 are transmitted to a synthesizer 140. The value from the encoder index 210 of each encoder clock signals 215 is transmitted to the same synthesizer 140. The synthesizer 140 includes a voltage controlled oscillator 230. The frequency-shift elements include frequency information. The frequency information includes for example the phase difference between the encoder index 210 encoder clock signals 215 and the phase detected in the phase locked loop 220. The frequency-shift elements are valued using the feedback signal of the voltage controlled oscillator 230.

The values of the frequency-shifts are analyzed to provide the data needed to compensate for the frequency-shifts to generate a frequency-shift compensated clock 150. The frequency-shifts compensation processes are described in detail in FIG. 2B. The results of the frequency-shifts compensation processes create a frequency-shift compensated system master clock 230. The frequency-shift compensated system master clock 230 provides accurate angular-position reference of the rotary stage for position synchronization in for example rotary-stage e-beam writer systems 100 in one embodiment.

Figure 2B:
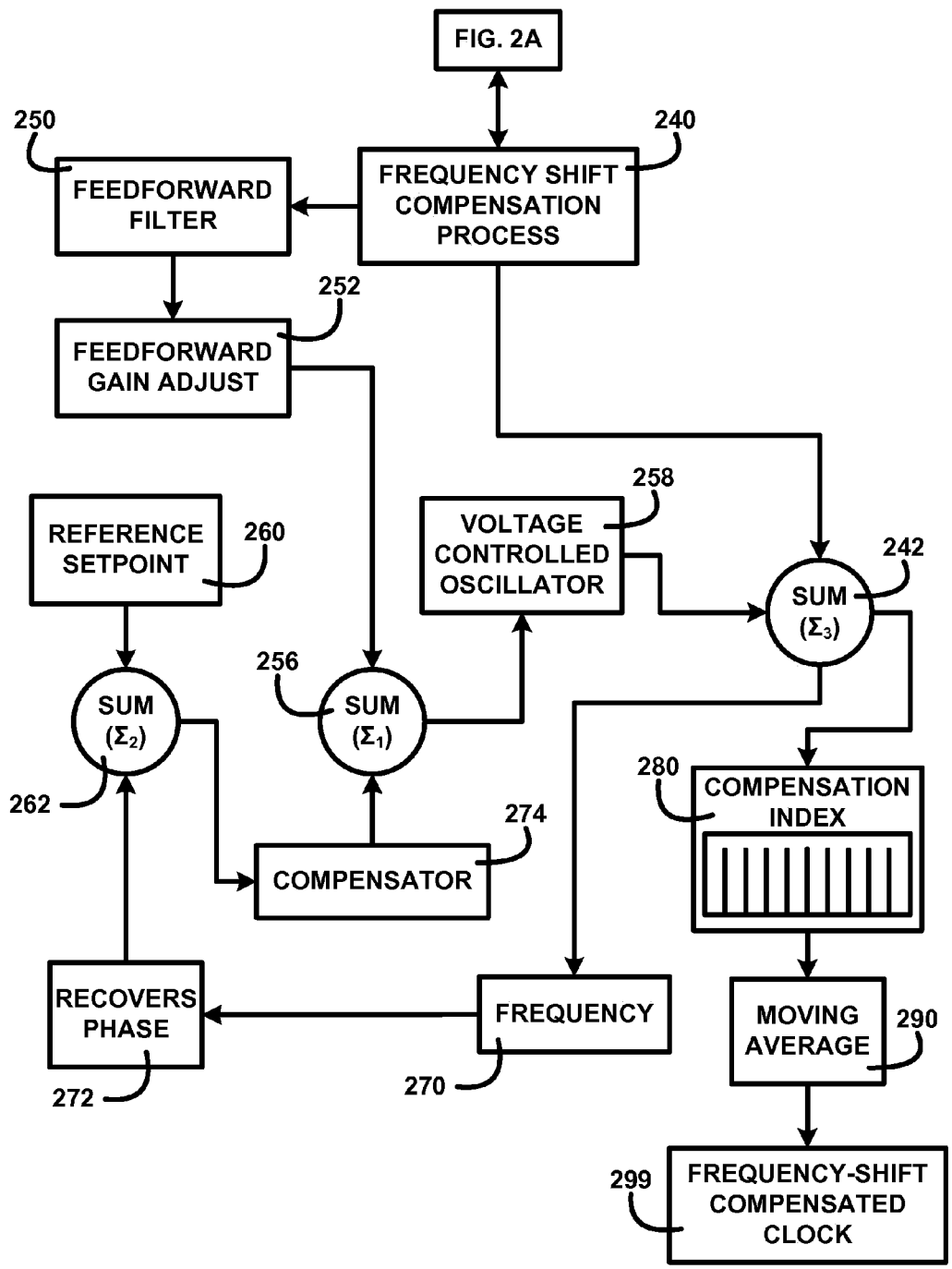
FIG. 2B shows a block diagram of an overview flow chart of a frequency-shift compensation process of one embodiment.

Frequency-Shift Compensation Process:

FIG. 2B shows a block diagram of an overview flow chart of a frequency-shift compensation process of one embodiment. FIG. 2B shows the continuation of the method for encoder frequency-shift compensation from FIG. 2A. The values of the frequency-shifts are from FIG. 2A are transmitted to a frequency-shift compensation process 240. The signal output from the synthesizer 140 of FIG. 1 passes through a feedforward filter 250.

Feedforward Filter:

The feedforward filter 250 creates an output of the direct and delay-line signal processing elements. The feedforward filter 250 output signals pass through a feedforward gain adjust 252. The gain is the mean ratio of the signal output of a system to the signal input of the same system. The feedforward gain adjust 252 is used to increase the power or amplitude of the feedforward filter output signals. This allows analysis of the feedforward filter 250 output signals such as delay-line interpolation. The gain adjusted feedforward filter output signals are entered into sum ($\Sigma_1$) 256. Sum ($\Sigma_1$) 256 include other signal processing elements from the frequency-shift compensation process 240.

Frequency Phase Recovery:

The frequency-shift compensation process 240 enters into sum ($\Sigma_3$) 242 the frequencies from the synthesizer 140 of FIG. 1. The frequencies include the frequency information learned in a phase locked loop 130 of FIG. 1 and the encoder clock signals 215 of FIG. 2A. The sum ($\Sigma_3$) 242 values of the frequencies information is used to process each frequency 270. The process recovers phase 272 information of each frequency 270. The phase information recovered is expressed in angular degrees and added to a reference setpoint 260 in sum no. 2 262. The reference setpoint 260 is a frequency phase angle reference constant expressed in angular degrees equal to zero.

Phase Angle Compensator:

The sum ($\Sigma_2$) 262 including the reference setpoint 260 zero angular degrees and the recovered phase angular degrees is processed through a compensator 274. The compensator 274 is used to adjust frequency response. The compensator 274 frequency response adjustment includes for example phase lag.

The compensator 274 frequency response adjustments are added to the gain adjusted feedforward filter output signals in sum ($\Sigma_1$) 256. The total of sum ($\Sigma_1$) 256 for a number of encoder clock signals 215 of FIG. 2A pulses is processed through a voltage controlled oscillator 258. The adjusted frequency elements are valued using the feedback signal of the voltage controlled oscillator 258. The adjusted frequency element values are added to the frequency element values from the synthesizer 140 of FIG. 1 in sum ($\Sigma_3$) 242. The totals of sum ($\Sigma_3$) 242 are recorded in a compensation index 280. The frequency elements totals of the compensation index 280 are used to create a moving average 290. The moving average 290 compensates for any phase difference in the angular frequency to offset the repeatable frequency-shifts 120 of the encoder clock signals 215 pulses.

The moving average 290 frequency results form a frequency-shift compensated clock 299. The method for encoder frequency-shift compensation produces a frequency-shift compensated clock 299 for use in patterned or discrete track stack or media systems to accurately pattern for example a high quality bit patterned or discrete track stack or media.

Figure 3A:
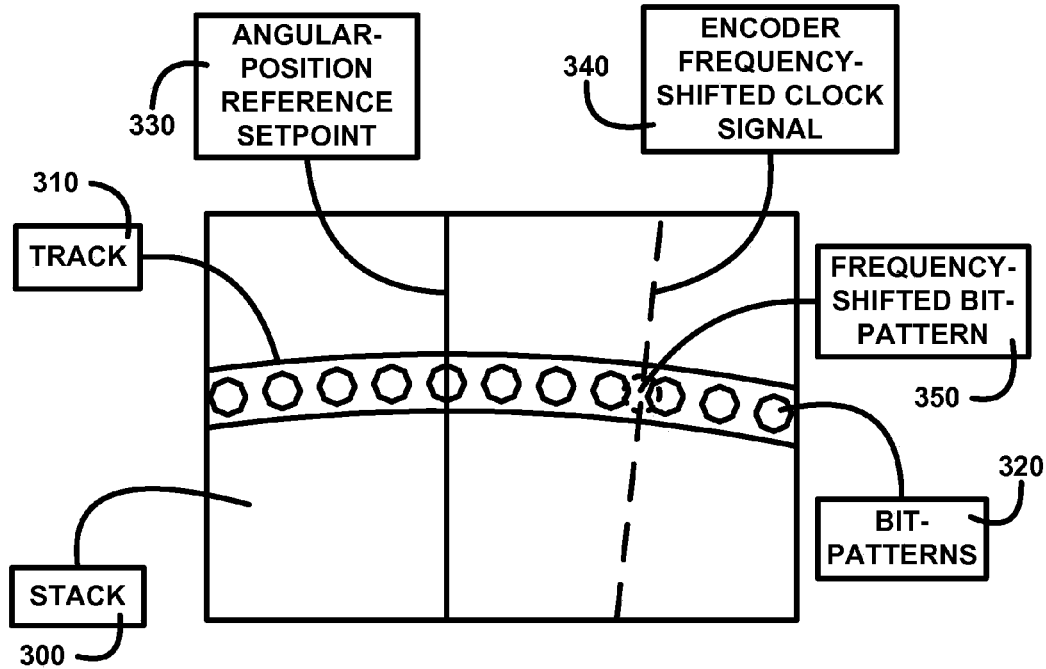
FIG. 3A shows for illustrative purposes only an example of an encoder frequency-shifted clock signal of one embodiment.

Encoder Frequency-Shifted Clock Signal:

FIG. 3A shows for illustrative purposes only an example of an encoder frequency-shifted clock signal of one embodiment. FIG. 3A shows a stack 300 that is being patterned for example as a bit-patterned stack using an encoder clock signals 215 of FIG. 2A. The stack 300 patterning includes one or more track 310 along which are created for example bit-patterns 320. The positioning of the bit-patterns 320 are in synchronization with the encoder clock signals 215 of FIG. 2A. The rotational angular location is referenced to an angular-position reference setpoint 330. An encoder frequency-shifted clock signal 340 causes the frequency-shifted bit-pattern 350 to be written out of the mastered location. This causes errors in both writing and reading functions on the misaligned patterned stack.

Figure 3B:
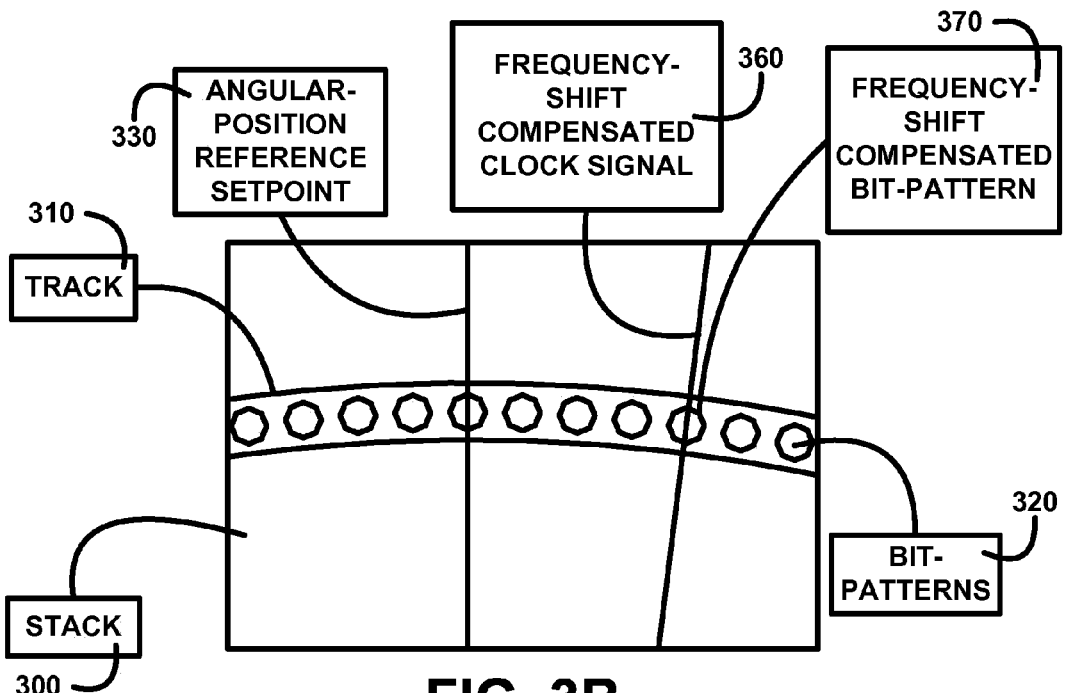
FIG. 3B shows for illustrative purposes only an example of an encoder frequency-shifted compensated clock signal of one embodiment.

Compensated Clock Signal:

FIG. 3B shows for illustrative purposes only an example of an encoder frequency-shifted compensated clock signal of one embodiment. FIG. 3B shows a stack 300 that is being patterned for example as a bit-patterned stack using the frequency-shift compensated clock 299 of FIG. 2B. The stack 300 patterning includes one or more track 310 along which are created for example bit-patterns 320. The positioning of the bit-patterns 320 is in synchronization with the frequency-shift compensated clock 299 of FIG. 2B. The frequency-shift compensated clock 299 of FIG. 2B creates a frequency-shift compensated clock signal 360 to provide an accurate placement from the angular-position reference setpoint 330.

Figure 4:
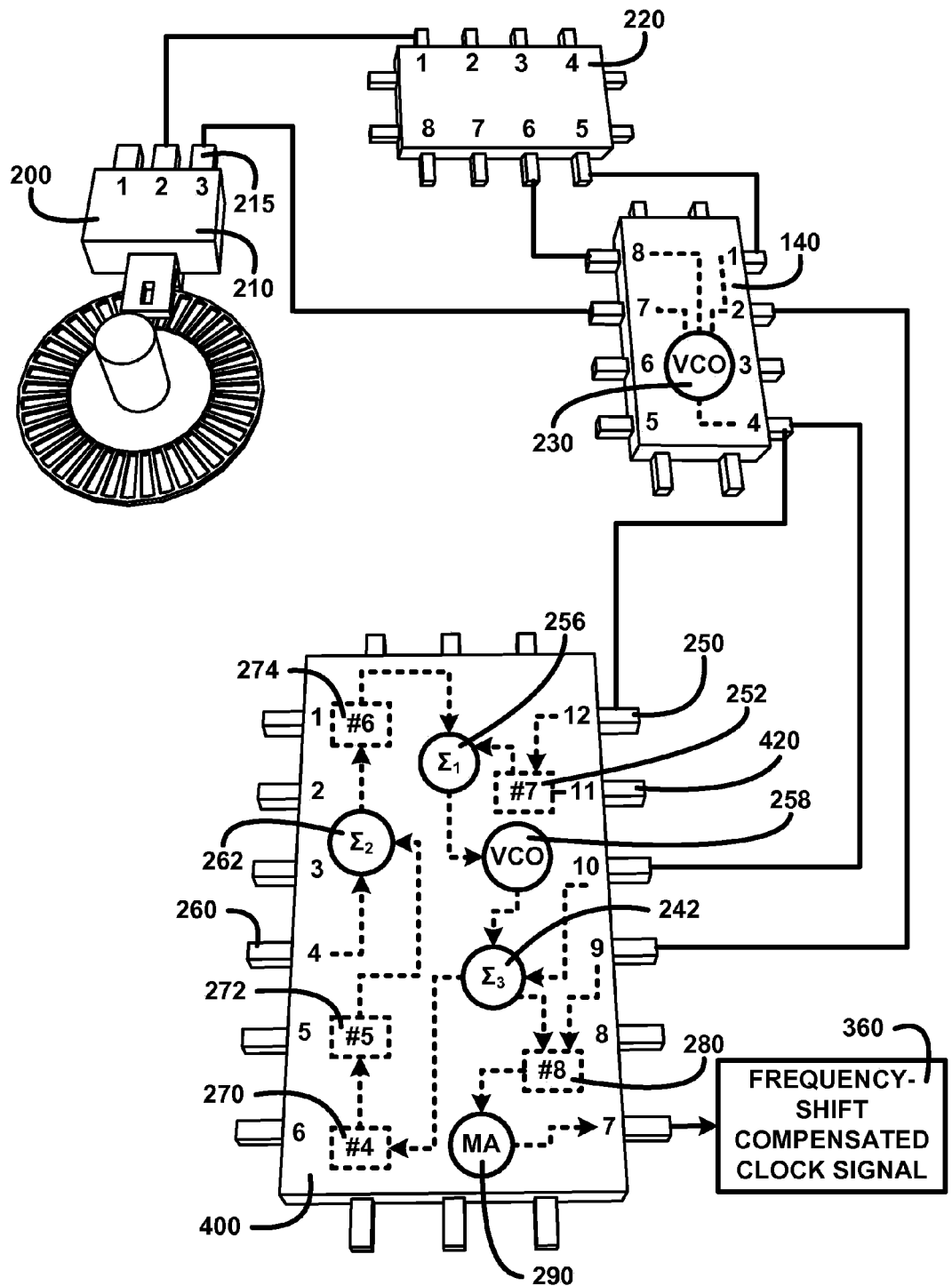
FIG. 4 shows for illustrative purposes only an example of an encoder frequency-shift compensation apparatus of one embodiment.

Encoder Frequency-Shift Compensation Apparatus:

FIG. 4 shows for illustrative purposes only an example of an encoder frequency-shift compensation apparatus of one embodiment. FIG. 4 shows the method for encoder frequency-shift compensation embodied in an apparatus. Deployment of the encoder frequency-shift compensation apparatus is available in any rotary system such as rotary-stage e-beam writer systems 100 of FIG. 1. FIG. 4 shows an example of an encoder 200 such as those used in rotary-stage e-beam writer systems 100 of FIG. 1. The encoder 200 can be configured as any type of rotary encoder such as analog or digital. The encoder 200 produces phase, frequency 270 and rotating vectors subject to frequency-shifts due to eccentricity 202 of FIG. 2A and uneven marks 204 of FIG. 2A of the encoder 200.

The method for encoder frequency-shift compensation is used to compensate for the frequency-shifts of a rotary encoder in a system. The method for encoder frequency-shift compensation in one embodiment can be components performing each function or operation in a separate device and connected by hardwire or a printed circuit board. In one embodiment one or more of the component devices are configured as analog devices or digital devices or a combination of both.

FIG. 4 shows for example one embodiment wherein the encoder frequency-shift compensation apparatus is configured comprising the phase locked loop counter 220 configured as an integrated circuit, the synthesizer 140 configured as an integrated circuit with the voltage controlled oscillator 230 incorporated into the circuitry and a frequency-shift compensation processor 400 configured as an integrated circuit. The frequency-shift compensation processor 400 is for example the frequency-shift compensation process 240 of FIG. 2B configured as an integrated circuit that performs the various functions and operations in a single digital device. The method for encoder frequency-shift compensation components are connected using a printed circuit board including the connections to the encoder 200.

Phase Locked Loop Counter:

A phase locked loop tries to generate an output signal whose phase is related to the phase of the input "reference" signal. The phase locked loop counter 220 includes a variable frequency oscillator and a phase detector. The phase locked loop counter 220 compares the phase of the input signal from the encoder 200 with the phase of the signal derived from its output oscillator and adjusts the frequency of its oscillator to keep the phases matched. The signal from the phase detector is used to control the oscillator in a feedback loop. The information derived from the operations of the phase locked loop counter 220 provides the basis for learning the frequency-shifts of the encoder 200 encoder clock signals 215.

The direct signal from the encoder 200 pin 1 is connected to the phase locked loop counter 220 pin 1. The phase locked loop counter 220 counts the number of encoder index 210 timed encoder readings represented as N. The phase locked loop counter 220 outputs the number signal from pin 5 to the synthesizer 140 pin 1. The phase locked loop counter 220 detects the phase of the encoder frequency-shift signal. The phase detected is transmitted from phase locked loop counter 220 pin 6 to the synthesizer 140 pin 8.

Synthesizer:

The synthesizer 140 integrated circuit routes the phase detected from pin 8 to the voltage controlled oscillator 230 digital device VCO. The encoder index 210 encoder clock signals 215 is transmitted from the encoder 200 pin 3 to the synthesizer 140 pin 7. The index timed encoder reading signal from pin 7 is inputted to the voltage controlled oscillator 230 digital device VCO. The synthesizer 140 and voltage controlled oscillator 230 identify the frequency, phase and amplitude of the frequency-shift encoder clock signals 215. The voltage controlled oscillator 230 outputs a frequency, phase and amplitude signal to pin 4. The voltage controlled oscillator 230 output signal from pin 4 is routed to both pin 10 and pin 12 of the frequency-shift compensation processor 400. The voltage controlled oscillator 230 output signal to pin 12 feeds to the feedforward filter 250 shown as a digital device #7. The synthesizer 140 transmits the number of encoder index 210 timed encoder readings represented as N in the number signal from pin 2 to pin 10 of the frequency-shift compensation processor 400.

Feedforward Filter:

The feedforward filter 250 separates the direct and delay-line signal processing elements. The feedforward filter 250 processes the signals using the feedforward gain adjust 252. The feedforward gain adjust 252 increases the gain or mean ratio of the signal output to the signal input from pin 12. The feedforward gain adjust 252 is used to increase the power or amplitude of the feedforward filter output signals. This allows analysis of the feedforward filter 250 output signals such as delay-line interpolation. The feedforward gain adjust 252 magnitude can be adjusted. A feedforward gain adjust factor input 420 connected to pin 11 allows for input to modify the gain adjustment factor. The gain adjusted feedforward filter output signals are entered into sum ($\Sigma_1$) 256, a digital device, allowing analysis of the signals such as delay-line interpolation. The sum ($\Sigma_1$) 256 includes other signal processing elements from the frequency-shift compensation processor 400.

Phase Recovery:

The voltage controlled oscillator 230 output signal that is routed to pin 9 of the frequency-shift compensation processor 400 inputs the frequency values to sum ($\Sigma_3$) 242 digital device #3. The frequency 270 value from sum ($\Sigma_3$) 242 is routed to a digital device #4 as a frequency 270 value (d$\Theta$/dt). A digital device #5 recovers phase 272 value using 1/S, a time Integration of the frequency 270 received from digital device #4. Frequency is the derivative of phase and the phase recovery uses that relationship to recover the phase of the voltage controlled oscillator 230 output signal from the synthesizer 140. The phase value of the frequency 270 is entered into sum ($\Sigma_2$) 262, a digital device.

The reference setpoint 260 can be set using input to pin 4. The reference setpoint 260 includes values such as zero degrees (0°) which are entered into sum ($\Sigma_2$) 262. The difference between the phase angles of the reference setpoint 260 and the recovered phase value is used to determine the instantaneous phase error of the signal. The sum ($\Sigma_2$) 262 is routed to the compensator 274 digital device #6.

Phase Angle Compensator:

The sum ($\Sigma_2$) 262 includes the reference setpoint 260 zero angular degrees and the recovered phase angular degrees. The compensator 274 adjusts the frequency response. The frequency response adjustment includes for example phase lag. The compensator 274 frequency response adjustments are added to the gain adjusted feedforward filter 250 gain adjusted output signals in sum ($\Sigma_1$) 256. The total for sum ($\Sigma_1$) 256 for the number of encoder index 210 timed encoder readings is routed to the voltage controlled oscillator 258 digital device VCO.

Voltage Controlled Oscillator:

The voltage controlled oscillator 258 processes the total for sum ($\Sigma_1$) 256. The oscillator generates an output signal. Voltage control can adjust the output signal. The compensated phase value is used to control the voltage. The compensated phase value may cause the frequency output signal of the voltage controlled oscillator 258 to increase or decrease relative to the reference encoder frequency-shift value. The compensated phase adjustments correct the errors caused by the frequency-shifts.

A feedback signal is generated using the voltage controlled oscillator 258. The feedback signal provides a value for the adjusted frequency elements. The values of the adjusted frequency element values of the voltage controlled oscillator 258 feedback signal are routed to sum ($\Sigma_3$) 242, a digital device. The feedback signal values are added to the frequency element values from the synthesizer 140 previously entered into sum ($\Sigma_3$) 242. The totals of the values in sum ($\Sigma_3$) 242 are routed to the compensation index 280 digital device #8.

Compensation Index:

The compensation index 280 records the values from sum ($\Sigma_3$) 242 as frequency-shift compensated values corresponding to the index timed encoder reading received through pin 10. The compensation index 280 forms an index of compensated timed frequency-shift encoder readings. The compensation index 280 routes the values of the compensated timed frequency-shift encoder readings to the moving average 290 digital device MA.

Moving Average:

The moving average 290 digital device MA computes a moving average 290. The moving average 290 includes the values of the compensated timed frequency-shift encoder readings from the compensation index 280. The moving average 290 using the formula ($\Sigma Yi(n)/N$); where Yi is the ith measurement from the compensated timed frequency-shift encoder readings (n). The moving average 290 then divides the result by N the total number of index timed encoder readings.

The moving average 290 represents a frequency-shift compensated clock signal 360 compensating for the encoder frequency-shifts. The moving average 290 digital device MA outputs through pin 7 of the frequency-shift compensation processor 400 the frequency-shift compensated clock signal 360.

The method for encoder frequency-shift compensation using the encoder frequency-shift compensation apparatus does generate a frequency-shift compensated clock 150 of FIG. 1. The frequency-shift compensated clock signal 360 is used for example in rotary-stage e-beam writer systems 100 to accurately pattern a bit patterned or discrete track stack.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method for encoder frequency-shift compensation, comprising:
    determining frequency values of an input encoder signal; determining repeatable frequency-shifts of the frequency values; and generating a frequency-shift compensated clock using the repeatable frequency-shifts.

2. The method of claim 1, further comprising recording the frequency-shifts in an encoder index, said encoder index providing encoder clock signals.

3. The method of claim 2, further comprising using a voltage controlled oscillator to analyze phase differences between an encoder index clock signal and the input encoder signal.

4. The method of claim 1, wherein the frequency values are converted to clock signals and processed in a counter chip.

5. The method of claim 1, wherein determining repeatable frequency-shifts of the frequency values comprises using a phase locked loop.

6. The method of claim 1, wherein determining repeatable frequency-shifts of the frequency values comprises calculating the differences in an encoder index encoder clock frequency phase and the values learned in a phase locked loop.

7. The method of claim 1, wherein generating a frequency-shift compensated clock comprises using a synthesizer to analyze values determined in the phase locked loop and of each encoder clock signal received from an encoder index.

8. The method of claim 1, further comprising using a feedforward filter to output direct and delayed signal processing elements and using a feedforward gain adjust to increase the power or amplitude of the feedforward filter output signals.

9. The method of claim 8, further comprising valuing the amplitude of the feedforward and compensator signals.

10. The method of claim 1, further comprising adjusting frequency phase differences, angular frequency and amplitude of a field.

11. The method of claim 1, further comprising recording the compensated signal values.

12. The method of claim 1, further comprising generating frequency compensated signal values that forms a frequency-shift compensated clock.

13. A frequency-shift compensated clock, comprising: a synthesizer configured to generate a frequency-shift compensated clock signal using repeatable frequency shifts and encoder clock signals.

14. The frequency-shift compensated clock of claim 13, wherein the frequency-shifted compensated clock signal frequency value is calculated using a summation of a number of compensated phase value, synthesized frequency value and an amplitude value.

15. The frequency-shift compensated clock of claim 13, wherein a compensation index is created using the sums of a number of identified, valued and adjusted encoder frequency-shift clock signal elements.

16. The frequency-shift compensated clock of claim 13, wherein the frequency-shift compensated clock signal is created from a compensation index using a moving average of a number of compensated frequency-shift values.

17. The frequency-shift compensated clock of claim 13, wherein phase control system comprises a phase locked loop counter.

18. The frequency-shift compensated clock of claim 17, wherein the phase control system further comprises a variable frequency oscillator and a phase detector.

19. The frequency-shift compensated clock of claim 13, wherein the synthesizer comprises a voltage controlled oscillator and a frequency-shift compensation processor.

20. The frequency-shift compensated clock of claim 13, further comprising a feedforward filter.

21. The frequency-shift compensated clock of claim 13, further comprising an encoder and a phase control system, wherein the synthesizer is configured to generate a frequency-shift compensated clock signal using repeatable frequency shifts from the encoder and encoder clock signals from the phase control system.

\* \* \* \* \*